(12) United States Patent
Hong et al.

(10) Patent No.: US 6,562,925 B2
(45) Date of Patent: May 13, 2003

(54) ORGANIC ANTI-REFLECTIVE COATING POLYMER, ANTI-REFLECTIVE COATING COMPOSITION AND METHODS OF PREPARATION THEREOF

(75) Inventors: Sung-eun Hong, Gyunggi-Do (KR); Min-ho Jung, Gyunggi-Do (KR); Jae-chang Jung, Gyunggi-Do (KR); Geun-su Lee, Gyunggi-Do (KR); Ki-ho Baik, Gyunggi-Do (KR)

(73) Assignee: Hynix Semiconductor Inc, Gyunggi-Do (KR)

( * ) Notice: Subject to any disclaimer, the term of this patent is extended or adjusted under 35 U.S.C. 154(b) by 0 days.

(21) Appl. No.: 09/891,004

(22) Filed: Jun. 25, 2001

(65) Prior Publication Data
US 2002/0090452 A1 Jul. 11, 2002

(30) Foreign Application Priority Data
Jun. 30, 2000 (KR) ........................ 2000-37272

(51) Int. Cl.[7] ............................ C08F 118/02
(52) U.S. Cl. .................. 526/312; 427/96; 427/384; 428/209; 428/411.1; 428/451; 428/901; 526/319
(58) Field of Search ................. 526/312, 319; 428/411.1, 209, 901, 451; 427/384, 96

(56) References Cited

U.S. PATENT DOCUMENTS

| | | | |
|---|---|---|---|
| 4,424,270 A | 1/1984 | Erdmann et al. | 430/166 |
| 4,822,718 A | 4/1989 | Latham et al. | 430/271 |
| 5,525,457 A | 6/1996 | Nemoto et al. | 430/325 |
| 5,674,648 A | 10/1997 | Brewer et al. | 430/18 |

FOREIGN PATENT DOCUMENTS

EP 1 035 147 A1 9/2000
WO WO 00/01752 1/2000

Primary Examiner—D. S. Nakarani
(74) Attorney, Agent, or Firm—Marshall, Gerstein & Borun

(57) ABSTRACT

An organic anti-reflective polymer having the following Formula 1, its preparation method, an anti-reflective coating composition comprising the organic anti-reflective polymer and a preparation method of an anti-reflective coating made therefrom. The anti-reflective coating comprising the polymer eliminates standing waves caused by the optical properties of lower layers on the wafer and by the thickness changes of the photoresist, prevents back reflection and CD alteration caused by the diffracted and reflected light from such lower layers. Such advantages enable the formation of stable ultrafine patterns suitable for 64M, 256M, 1G, 4G, and 16G DRAM semiconductor devices, improving the production yields and controlling the k values. It is also possible to prevent undercutting due to an unbalanced acidity after finishing the coating.

Formula I

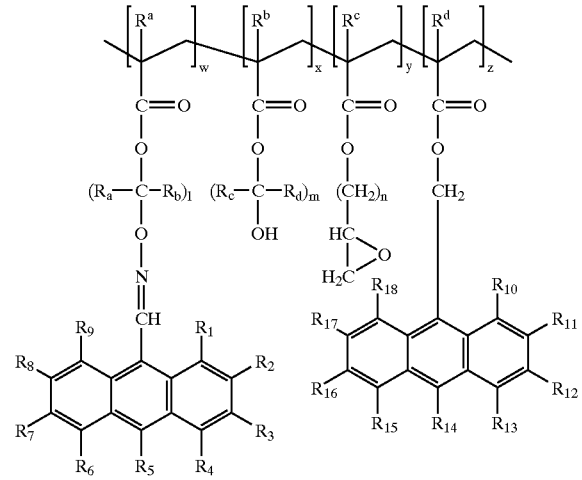

18 Claims, No Drawings

ORGANIC ANTI-REFLECTIVE COATING POLYMER, ANTI-REFLECTIVE COATING COMPOSITION AND METHODS OF PREPARATION THEREOF

BACKGROUND

1. Technical Field

An organic anti-reflective polymer and its preparation method are disclosed. The organic anti-reflective polymer prevents back reflection of lower film layers and eliminates a standing wave that occurs as a result of thickness changes of the photoresist and light, in a lithographic process using 248 nm KrF and 193 nm ArF laser light sources for fabricating ultrafine patterns. More particularly, the organic anti-reflective polymer is useful for fabricating ultrafine patterns of 64 M, 256 M, 1 G, and 4 G DRAM semiconductor devices. A composition containing such organic anti-reflective polymer, an anti-reflective coating layer made therefrom and a method of preparation are also disclosed thereof.

2. Description of the Background Art

In a fabrication process of ultrafine patterns for preparing semiconductor devices, standing waves and reflective notching inevitably occur due to the optical properties of lower film layer on the wafer and due to a thickness variation in the photosensitive film. In addition, there is another problem of the CD (critical dimension) alteration caused by diffracted and reflected light from the lower film layers. Thus, it has been suggested to introduce anti-reflective coating that enables preventing back reflection at a lower film layer by introducing organic material showing high absorbance at a wavelength range of the light employed as a light source.

Anti-reflective coating is classified into inorganic and organic anti-reflective coating depending upon the material used, or into absorptive and interfering anti-reflective coating based on the operation mechanism. For microlithography using I-line (365 nm wavelength) radiation, inorganic anti-reflective coating is predominantly used, while TiN and amorphous carbon as an absorptive system and SiON as an interfering system are employed.

In a fabrication process of ultrafine patterns using KrF laser, SiON has been mainly used as an inorganic anti-reflective film. However, in the case of an inorganic anti-reflective film, no material has been known which enables the control of the interference at 193 nm, the wavelength of light source. Thus, there has been great deal of efforts to employ an organic compound as an anti-reflective coating.

To be a good organic anti-reflective coating, the following conditions must be satisfied. First, peeling of the photoresist layer due to the dissolution in a solvent must not take place when conducting a lithographic process. In order to achieve this goal, a molded coating must be designed to form a cross-linked structure without producing any chemical as a by-product. Second, chemicals such as acid or amine must not migrate into or out from the anti-reflective coating. This is because when acid migrates from anti-reflective coating, undercutting occurs at a lower part of the pattern while footing may occur when a base such as amine migrates. Third, the etching speed of the anti-reflective coating should be faster than that of the upper photosensitive film so as to facilitate etching process by using photosensitive film as a mask. Finally, the anti-reflective coating must be as thin as possible to an extent to sufficiently play a role as an anti-reflective coating.

The existing organic anti-reflective material is mainly divided into two types: (1) polymers containing chromophore, cross-linking agent (single molecule) cross-linking the polymers and an additive (thermally variable oxidant); and (2) polymers which can cross link by themselves and contain chromophore and an additive (thermally variable oxidant). But these two types of anti-reflective material have a problem in that the control of k value is almost impossible because the content of the chromophore is defined according to the ratio as originally designed at the time of polymerization. Thus, if it is desired to change the k value, the polymer must be synthesized again.

SUMMARY OF THE DISCLOSURE

A novel organic polymer for anti-reflective coating and its preparation are disclosed method.

An anti-reflective coating composition comprising the aforementioned polymer and a preparation method thereof are also disclosed A semiconductor device on which a pattern is formed from such an anti-reflective coating by submicrolithography is also disclosed.

DETAILED DESCRIPTION OF THE PRESENTLY PREFERRED EMBODIMENTS

The following polymer compounds having Formulas 1 and 2, respectively are provided which can be used in an anti-reflective coating.

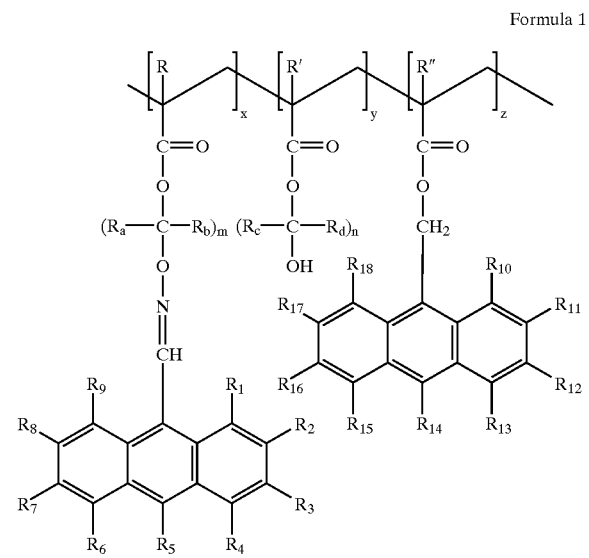

Formula 1

Formula 2

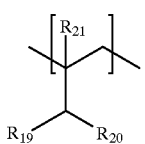

In the above Formulas 1 and 2:

R, R', and R" are each independently hydrogen or methyl; $R_a$ to $R_d$, and $R_1$ to $R_{18}$ are each independently —H, —OH, —OCOCH$_3$, —COOH, —CH$_2$OH, or substituted or unsubstituted, or straight or branched alkyl or alkoxy alkyl having 1 to 5 carbon atoms; m and n each represents an integer selected from 1, 2, 3, 4 and 5; x, y, and z each represents mole fraction from 0.01 to 0.99; $R_{19}$ and $R_{20}$ are each independently straight or branched substituted $C_{1-10}$ alkoxy; and $R_{21}$ is hydrogen or methyl.

The compound of Formula 2 is prepared by polymerizing (meth)acrolein to obtain poly(meth)acrolein followed by reacting the obtained polymeric product with branched or straight substituted alkyl alcohol having 1 to 10 carbon atoms.

In detail, (meth)acrolein is first dissolved in an organic solvent and added thereto a polymerization initiator to carry out polymerization under vacuum at a temperature ranging from about 60 to about 70° C. for a time period from about 4 to about 6 hours. Then, the obtained polymeric product is reacted with branched or straight substituted alkyl alcohol having 1 to 10 carbon atoms in the presence of trifluoromethylsulfonic acid as a catalyst at a room temperature for a time period ranging from about 20 to about 30 hours.

In the above process, suitable organic solvent is selected from the group consisting of tetrahydrofuran (THF), cyclohexanone, dimethylformamide, dimethylsulfoxide, dioxane, methylethylketone, benzene, toluene, xylene and mixtures thereof. As a polymerization initiator, it can be mentioned 2,2-azobisisobutyronitrile (AIBN), benzoylperoxide, acetylperoxide, laurylperoxide, t-butylperacetate, t-butylhydroperoxide or di-t-butylperoxide. A preferred example of the said alkyl alcohol having 1 to 10 carbon atoms is ethanol or methanol.

A preferred compound of Formula 2 is selected from the group consisting of the compounds of the following Formulas 3 to 6.

Formula 3

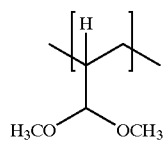

Formula 4

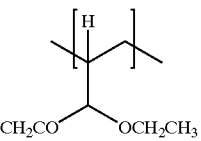

Formula 5

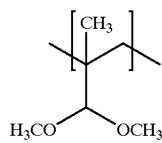

Formula 6

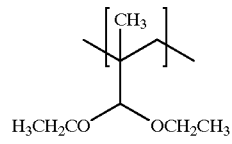

The above compounds of Formulas 3 to 6 are readily cured in the presence of acid and other polymers having alcohol group.

The polymer of Formula 1 is prepared by reacting 9-anthracene methyliminealkylacrylate monomer, hydroxyalkylacrylate monomer, glycidylalkylacrylate monomer and 9-anthracenealkylmethacrylate monomer in an organic solvent and then polymerizing the obtained compound with a polymerization initiator. Any conventional organic solvent can be used in this process but a preferred solvent is selected from the group consisting of tetrahydrofuran, toluene, benzene, methylethylketone, dioxane and mixtures thereof. As a polymerization initiator, any conventional radical polymerization initiator can be used but it is preferred to use a compound selected from the group consisting of 2,2'-azobisisobutyronitrile, acetylperoxide, laurylperoxide, and t-butylperoxide. The above polymerization reaction is preferably carried out at a temperature ranging from about 50 to about 90° C. and each of the monomers has a mole fraction ranging from about 0.01 to about 0.99.

An effective anti-reflective coating composition can comprise a polymer of Formula 1 and a polymer of Formula 2.

Further, an effective anti-reflective coating composition can comprise a polymer of Formula 1, a compound of Formula 2 and an anthracene derivative as an additive. Illustrative, non-limiting examples of the anthracene derivatives (hereinafter, "anthracene derivative additive") is selected from the group consisting of anthracene, 9-anthracenemethanol, 9-anthracenecarbonitrile, 9-anthracene carboxylic acid, dithranol, 1,2,10-anthracentriol, anthraflavonic acid, 9-anthraldehydeoxime, 9-anthraldehyde, 2-amino-7-methyl-5-oxo-5H-[1]benzo-pyrano[2,3-b]pyridine-3-carbonitrile, 1-aminoanthraquinone, anthraquinone-2-carboxylic acid, 1,5-dihydroxyanthraquinone, anthrone, 9-anthryle trifluoromethylketone, 9-alkylanthracene derivatives of the following Formula 7, 9-carboxylanthracene derivatives of the following Formula 8, 1-carboxylanthracene derivatives of the following Formula 9, and mixtures thereof.

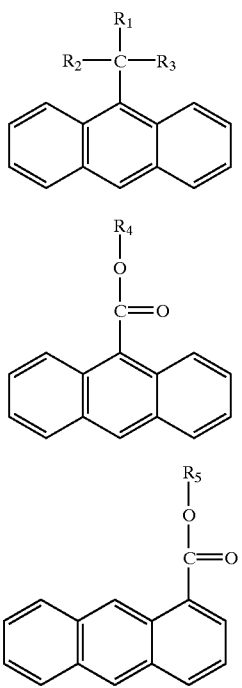

Formula 7

Formula 8

Formula 9 wherein, $R_1$ to $R_5$ are —H, —OH, —CH$_2$OH or substituted or unsubstituted, straight or branched alkyl or alkoxyalkyl having 1 to 5 carbon atoms.

A preparation method of an organic anti-reflective coating can comprise the steps of dissolving a polymer of Formula 1 and a compound of Formula 2 in an organic solvent, filtering the obtained solution alone or in combination with at least one anthracene derivative additive as aforementioned, coating the filtrate on a lower layer and hard-baking the coated layer. More particularly, any organic solvent can be used in the present preparation method but it is preferred to select the organic solvent from the group consisting of ethyl 3-ethoxypropionate, methyl 3-methoxypropionate, cyclohexanone, and propyleneglycolmethylether acetate. The aforementioned organic solvent is preferably used in an amount ranging from about 200 to about 5,000 wt. % based on the total weight of the anti-reflective coating resin used. The preferred temperature for hard-baking ranges from about 100 to about 300° C.

A semiconductor device can be prepared from any of the aforementioned anti-reflective coating compositions set forth herein.

Two monomers each having a chromophore of high absorbance (anthracenemethyliminealkylacrylate monomer and anthracenemethylmethacrylate monomer) was first synthesized to enable for a polymer made therefrom to show a high absorbance at the wavelength of 248 nm. The polymer made from these two monomers is referred to as a primary polymer (the compound of Formula 1). Because one of these two monomers having chromophore is weakly basic, it is believed that any undercutting due to an unbalanced acidity after finishing the coating is prevented. Further, in order to allow improved properties to a produced organic anti-reflective coating, such as good molding property, air-tightness, and dissolution resistance, a secondary polymer (the compound of Formula 2) capable of forming a cross linkage upon the reaction with an alcohol group in resin was also synthesized to cause a cross-linking reaction during a hard-baking step following a coating step. The secondary polymer mixed with the primary polymer can form a cross-linked product by a thermal reaction.

In particular, since the cross-linking agents used are in the form of a polymer are designed to maximize the efficiency of the cross-linking reaction, it is possible to freely adjust the k value of the anti-reflective coating by controlling the proportion of the primary polymer.

Further, the anti-reflective coating resin has a good solubility in all of the hydrocarbon solvents while has a dissolution resistance in any of the solvents during a hard-baking step. In addition, no undercutting or footing is experienced in the fabrication process of patterns using the same. Especially, because the anti-reflective coating resin of the present invention is made from acrylate polymer, which enables higher etching speed relative to, that of the photosensitive film during etching process, the etching selectivity is improved.

The following examples are set forth to illustrate more clearly the principles and practice of this disclosure to a person skilled in the art. As such, they are not intended to be limiting, but are simply illustrative of certain preferred embodiments.

EXAMPLES

Example 1—Preparation of poly[9-anthracenemethyliminealkylacrylate-(2-hydroxyethylacrylate)-(9-anthracenemethacrylate)]

A 500 ml round bottom flask was charged with 0.1 mole of 9-anthracenemethyliminethylacrylate monomer/0.5 mole of 2-hydroxyethylacrylate/0.4 mole of 9-anthracenemethylmethacrylate with stirring and 300 g of separately prepared tetrahydrofuran was added to a complete mixture. Thereafter, from about 0.1 to about 3.0 g of 2,2'-azobisisobutyronitrile was added to allow a polymerization reaction at a temperature ranging from about 60 to about 75° C. under a nitrogen atmosphere for a time period ranging from about 5 to about 20 hours. After the completion of the reaction, the obtained solution was precipitated with ethyl ether or n-hexane solvent and then filtered and dried to obtain poly[9-anthracenemethyliminethylacrylate-(2-hydroxyethyl-acrylate)-(9-anthracene methylmethacrylate)] resin of the following Formula 10 (yield: 81%).

Formula 10

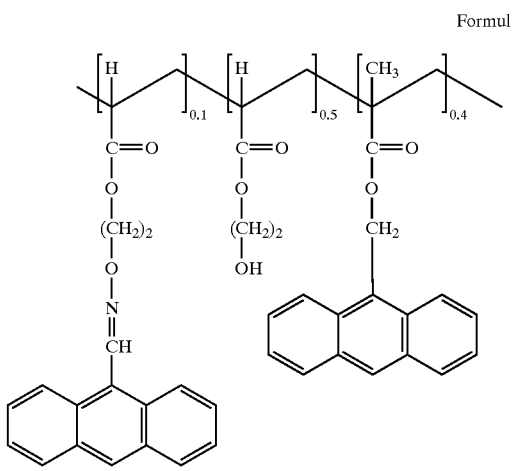

Example 2—Preparation of poly[-anthracenemethylimineethylmethacrylate-(2-hydroxyethylmethacrylate)-(9-anthracenemethylacrylate)]

A 500 ml round bottom flask was charged with 0.1 mole of 9-anthracenemethylimineethylmethacrylate monomer/0.5 mole of 2-hydroxyethylmethacrylate/0.4 mole of 9-anthracenemethylacrylate with stirring and 300 g of separately prepared tetrahydrofuran was added to a complete mixture. Thereafter, from about 0.1 to about 3.0 g of 2,2'-azobisisobutyronitrile was added to allow a polymerization reaction at a temperature ranging from about 60 to about 75° C. under a nitrogen atmosphere for a time period ranging from about 5 to about 20 hours. After the completion of the reaction, the obtained solution was precipitated with ethyl ether or n-hexane solvent and then filtered and dried to obtain poly[9-anthracenemethuliminee thylmethylmethacrylate-(2-hydroxyethylmethylmethacrylate)-(9-anthracenemethylacrylate)] resin of the following Formula 11 (yield: 84%).

Formula 11

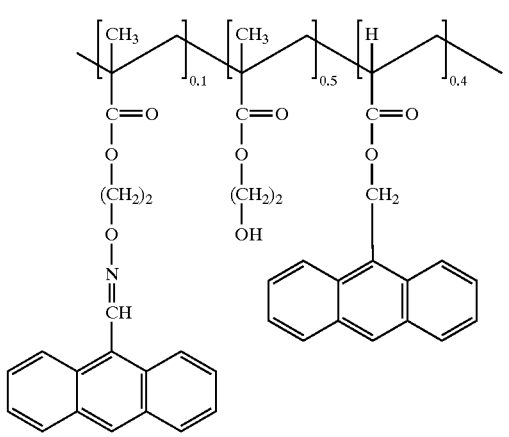

Example 3—Preparation of poly[9-anthracenemethyliminepropylacrylate-(3-hydroxypropylacrylate)-(9-antracenemethylmethacrylate)]

A 500 ml round bottom flask was charged with 0.1 mole of 9-anthracenemethyliminepropylacrylate monomer/0.5 mole of 3-hydroxypropylacrylate/0.4 mole of 9-anthracenemethylmethacrylate with stirring and 300 g of separately prepared tetrahydrofuran was added to a complete mixture. Thereafter, from about 0.1 to about 3.0 g of 2,2'-azobisisobutyronitrile was added to allow a polymerization reaction at a temperature ranging from about 60 to about 75° C. under a nitrogen atmosphere for a time period ranging from about 5 to about 20 hours. After the completion of the reaction, the obtained solution was precipitated with ethyl ether or n-hexane solvent and then filtered and dried to obtain poly[9-anthracenemethyliminepropylacrylate-(3-hydroxypropylacrylate)-(9-anthracenemethylmethacrylate)] resin of the following Formula 12 (yield: 82%).

Formula 12

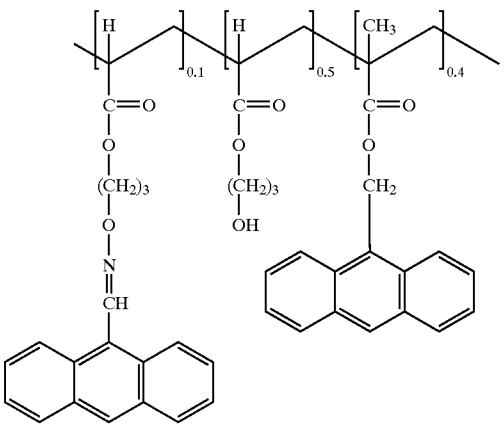

Example 4—Preparation of poly[9-anthracenemethyliminepropylmethacrylate-(2-hydroxyethylmethacrylate)-(9-anthracenemethylacrylate)]

A 500 ml round bottom flask was charged with 0.1 mole of 9-anthracenemethyliminepropylacrylate monomer/0.5 mole of 2-hydroxyethylmethacrylate/0.4 mole of 9-anthracenemethylacrylate with stirring and 300 g of separately prepared tetrahydrofuran was added to a complete mixture. Thereafter, from about 0.1 to about 3.0 g of 2,2'-azobisisobutyronitrile was added to allow a polymerization reaction at a temperature ranging from about 60 to about 75° C. under a nitrogen atmosphere for a time period ranging from about 5 to about 20 hours. After the completion of the reaction, the obtained solution was precipitated with ethyl ether or n-hexane solvent and then filtered and dried to obtain poly[9-anthracenemethyliminepropylacrylate-(2-hydroxyethylmethacrylate)-(9-anthra cenemethylacrylate)] resin of the following Formula 13 (yield: 83%).

Formula 13

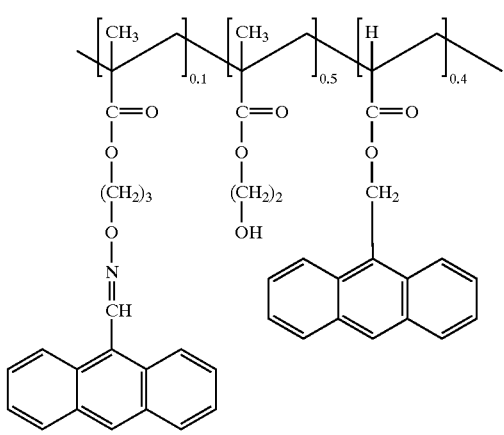

Example 5—Preparation of poly[9-anthracenemethyliminepropylmethacrylate-(3-hydroxypropylacrylate)-(9-anthracenemethylmethacrylate)]

A 500 ml round bottom flask was charged with 0.1 mole of 9-anthracenemethyliminepropylmethacrylate monomer/ 0.5 mole of 3-hydroxypropylacrylate/0.4 mole of 9-anthracenemethylmethacrylate with stirring and 300 g of separately prepared tetrahydrofuran was added to a complete mixture. Thereafter, from about 0.1 to about 3.0 g of 2,2'-azobisisobutyronitrile was added to allow a polymerization reaction at a temperature ranging from about 60 to about 75° C. under a nitrogen atmosphere for a time period ranging from about 5 to about 20 hours. After the completion of the reaction, the obtained solution was precipitated with ethyl ether or n-hexane solvent and then filtered and dried to obtain poly[9-anthracenemethyliminepropylmethacrylate-(3-hydroxypropylacrylate)-(9-anthracenemethylmethacrylate)] resin of the following Formula 14 (yield: 81%).

Formula 14

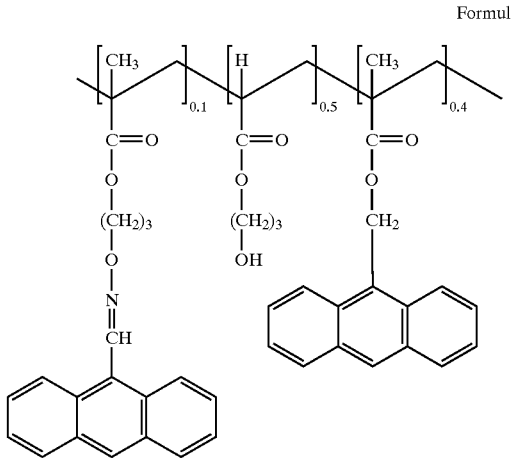

Example 6—Preparation of poly[9-anthracenemethyliminepropylmethacrylate-(4-hydroxybutylacrylate)-(9-anthracenemethylmethacrylate)]

A 500 ml round bottom flask was charged with 0.1 mole of 9-antbracenemethyliminepropylmethacrylate monomer/ 0.5 mole of 4-hydroxybutylacrylate/0.4 mole of 9-anthracenemethylmethacrylate with stirring and 300 g of separately prepared tetrahydrofuran was added to a complete mixture. Thereafter, from about 0.1 to about 3.0 g of 2,2'-azobisisobutyronitrile was added to allow a polymerization reaction at a temperature ranging from about 60 to about 750 under a nitrogen atmosphere for a time period ranging from about 5 to about 20 hours. After the completion of the reaction, the obtained solution was precipitated with ethyl ether or n-hexane solvent and then filtered and dried to obtain poly[9-anthracenemethyliminepropylmethacrylate-(3-hydroxypropylacrylate)-(9-anthr cenemethylmethacrylate)] resin of the following Formula 15 (yield: 80%).

Formula 15

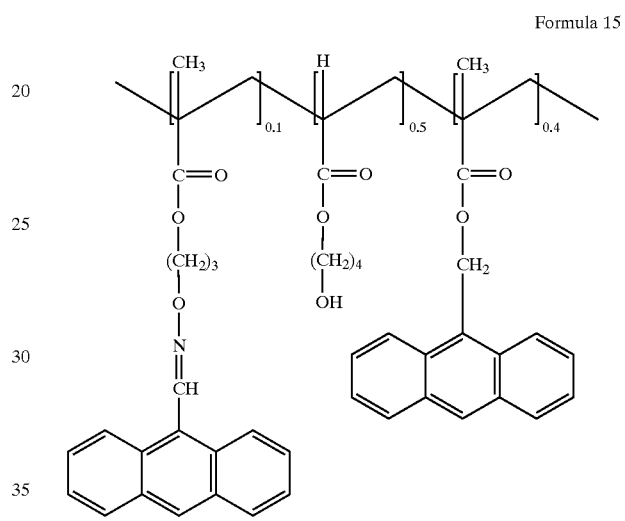

Example 7—Preparation of an anti-reflective coating solution

A polymer of Formula 1 as prepared in one of Examples 1 to 6 and a polymer of Formula 2 were dissolved in propyleneglycolmethylether acetate. The obtained solution, alone or in combination with from about 0.1 to about 30 wt. % of at least one of the aforementioned anthracene derivative additive to complete dissolution, was filtered, coated on a wafer, and hard-baked at a temperature ranging from about 100 to about 300° C. for a time period ranging from about 10 to about 1,000 seconds. Then, a photosensitive film was applied thereon and followed by a routine ultrafine pattern fabrication process.

The cross-linking agent used is in the form of a polymer is designed to maximize the cross-linking efficiency. Further, it is possible to freely control the k value of an organic anti-reflective coating by changing the proportion of a primary polymer. Thus, the prior art problem wherein the control of a k value was not possible has been overcome.

Moreover, the anti-reflective coating resin includes two monomers each having a chromophore of high absorbance that enables a polymer made therefrom to show a high absorbance at the wavelength of 248 nm. Because one of these two chromophores is weakly basic, it is possible to prevent an undercutting which is caused by an unbalanced acidity after finishing the coating. Further, the anti-reflective coating resin dissolves well in all hydrocarbon solvent, while does not dissolve in any of the solvents during a hard-baking step and it does not experience undercutting and footing in a fabrication process of patterns. Particularly, because the anti-reflective coating resin is composed of acrylate polymer, its etching speed is higher than that of a photosensitive film and thus, the etching selectivity can be improved.

The present invention has been described in an illustrative manner, and it is to be understood the terminology used is intended to be in the nature of description rather than of limitation. It must be understood that many modifications and variations of the present invention are possible in light of the above teachings. Therefore, it is to be understood that within the scope of the appended claims, the invention may be practiced otherwise than as specifically described.

What is claimed is:

1. A polymer having the structure of the following Formula 1:

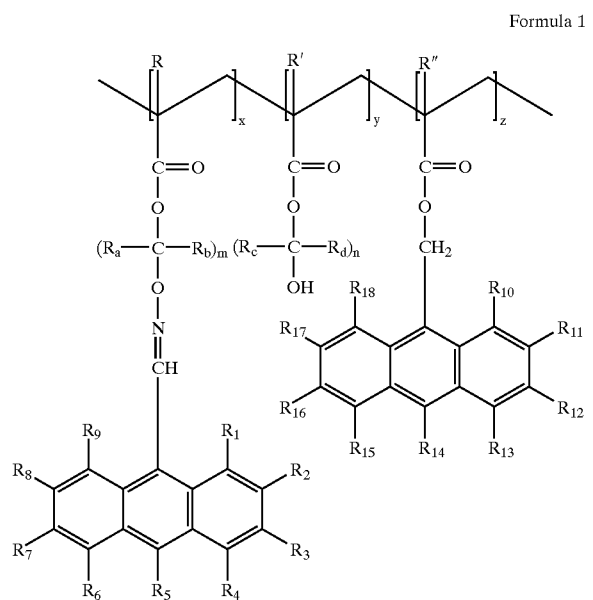

Formula 1 wherein, R, R', and R" are each independently selected from the group consisting of hydrogen and methyl;
$R_a$ to $R_d$, and $R_1$ to $R_{18}$ are each independently selected from the group consisting of —H, —OH, —OCOCH$_3$, —COOH, —CH$_2$OH, or alkyl having 1 to 5 carbon atoms and alkoxy alkyl having 1 to 5 carbon atoms;
m and n each represent an integer selected from the group consisting of 1, 2, 3, 4 and 5;
x, y, and z each represent a mole fraction of the polymer ranging from about 0.01 to about 0.99 and cumulatively equal 1.0.

2. The polymer of claim 1 which is poly[9-anthracenemethylimineethylacrylate-(2-hydroxyethylacrylate)-(9-anthracenemethylmethacrylate)], wherein R and R' are hydrogen, R" is methyl, $R_a$ to $R_d$ are methyl, $R_1$ to $R_{18}$ are each independently hydrogen, m and n each represent 2, and x, y and z are each 0.1, 0.5, and 0.4, respectively.

3. The polymer of claim 1 which is poly[9-anthracenemethylimineethylmethacrylate-(2-hydroxyethylmethacrylate)-(9-anthraceneacrylate)], wherein R, and R' are each methyl, R" is hydrogen, $R_a$ to $R_d$ are methyl, $R_1$ to $R_{18}$ are each hydrogen, m and n each represent 2, and x, y and z are each 0.1, 0.5, and 0.4, respectively.

4. The polymer of claim 1 which is poly[9-anthracenemethyliminepropylacrylate-(3-hydroxypropylacrylate)-(9-anthracenemethylmethacrylate)], wherein R and R' are hydrogen, R" is methyl, $R_a$ to $R_d$ are methyl, $R_1$ to $R_{18}$ are each hydrogen, m and n are each 3, and x, y and z are each 0.1, 0.5, and 0.4, respectively.

5. The polymer of claim 1 which is poly[9-anthracenemethyliminepropylmethacrylate-(2-hydroxyethylmethacrylate)-(9-anthraceneacrylate)], wherein R and R' are each methyl, R" is hydrogen, $R_a$ to $R_d$ are methyl, $R_1$ to $R_{18}$ are each hydrogen, m is 3, and x, y and z are each 0.1, 0.5, and 0.4, respectively.

6. The polymer of claim 1 which is poly[9-anthracenemethyliminepropylmethacrylate-(3-hydroxypropylacrylate)-(9-anthracenemethylmethacrylate)], wherein R and R" are each independently methyl, R' is hydrogen, $R_a$ to $R_d$ are methyl, $R_1$ to $R_{18}$ are each hydrogen, m and n are each 3, and x, y and z are each 0.1, 0.5, and 0.4, respectively.

7. The polymer of claim 1 which is poly[9-anthracenemethyliminepropylmethacrylate-(4-hydroxybutylacrylate)-(9-anthracenemethylmethacrylate)], wherein R and R" are each methyl, R' is hydrogen $R_a$ to $R_d$ are methyl, $R_1$ to $R_{18}$ are each hydrogen, m and n are each 3 and 4, respectively, and x, y and z are each 0.1, 0.5, and 0.4, respectively.

8. A method for preparing a polymer of claim 1, which comprises:
   reacting 9-anthracenemethyliminealkylacrylate monomer, hydroxyalkyl-acrylate monomer, and 9-anthracenealkylmethacrylate in a solvent to obtain a product; and
   polymerizing the product with a polymerization initiator.

9. The method of claim 8, wherein the solvent is selected from the group consisting of tetrahydrofuran, toluene, benzene, methylethylketone, dioxane and mixtures thereof.

10. The method of claim 8, wherein the polymerization initiator is selected from the group consisting of 2,2'-azobisisobutyronitrile, acetylperoxide, laurylperoxide, t-butylperoxide, and mixtures thereof.

11. The method of claim 8, wherein the polymerization is carried out at a temperature ranging from about 50 to about 90° C.

12. An anti-reflective coating composition comprising:
   a polymer of claim 1 and a polymer of the following Formula 2:

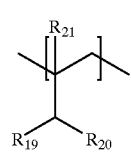

Formula 2 wherein, $R_{19}$ and $R_{20}$ are each alkyl having 1 to 10 carbon atoms or alkoxy having 1 to 10 carbon atoms; and $R_{21}$ is hydrogen or methyl.

13. The composition of claim 12 further comprising an additive selected from the group consisting of anthracene, 9-anthracenemethanol, 9-anthracenecarbonitrile, 9-anthracene carboxylic acid, dithranol, 1,2,10-anthracentriol, anthraflavonic acid, 9-anthraldehydeoxime, 9-anthraldehyde, 2-amino-7-methyl-5-oxo-5H-[1]benzopyrano[2,3-b]pyridine-3-carbonitrile, 1-aminoanthraquinone, anthraquinone-2-carboxylic acid, 1,5-dihydroxyanthraquinone, anthrone, 9-anthryle trifluoromethylketone, 9-alkylanthracene, 9-carboxylanthracene, 1-carboxylanthracene and mixtures thereof.

14. A method for preparing an anti-reflective coating comprising:
   dissolving the polymer of claim 1 and the polymer of Formula 2 in an organic solvent to obtain a solution;
   filtering the solution alone or in combination with an additive selected from the group consisting of anthracene, 9-anthracenemethanol, 9-anthracenecarbonitrile, 9-anthracene carboxylic acid, dithranol, 1,2,10-anthracentriol, anthraflavonic acid, 9-anthraldehydeoxime, 9-anthraldehyde, 2-amino-7-methyl-5-oxo-5H-[1]benzopyrano[2,3-b]pyridine-3-carbonitrile, 1-amino-anthraquinone, anthraquinone-2-carboxylic acid, 1,5-dihydroxyanthraquinone, anthrone, 9-anthryle trifluoromethylketone, 9-alkylanthracene, 9-carboxylanthracene, 1-carboxylanthracene and mixtures thereof to obtain a filtrate;
   coating a substrate with the filtrate to form a coated layer thereon; and
   baking the coated layer and substrate.

15. The method of claim 14, wherein the organic solvent is selected from the group consisting of ethyl-3-ethoxypropionate, methyl 3-methoxypropionate, cyclohexanone, and propyleneglycolmethylether acetate and is used in an amount ranging from about 200 to about 5,000 wt. % based on the total weight of the anti-reflective coating resin used.

16. The method of claim 14, wherein the hard-baking step is carried out at a temperature ranging from about 100 to about 300° C.

17. A semiconductor device prepared from the anti-reflective coating composition of claim 12.

18. A semiconductor device prepared from the anti-reflective coating composition of claim 13.

* * * * *